(12) United States Patent
Itoh

(10) Patent No.: US 6,265,070 B1
(45) Date of Patent: *Jul. 24, 2001

(54) ELECTROSTATIC-ERASING ABRASION-PROOF COATING AND METHOD FOR FORMING THE SAME

(75) Inventor: Kenji Itoh, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/064,779

(22) Filed: Apr. 23, 1998

Related U.S. Application Data

(62) Division of application No. 08/016,240, filed on Feb. 11, 1993, which is a division of application No. 07/660,949, filed on Feb. 26, 1991, now Pat. No. 5,190,824, which is a continuation-in-part of application No. 07/318,541, filed on Mar. 3, 1989, now abandoned.

(30) Foreign Application Priority Data

Mar. 7, 1988 (JP) .................................................. 63-54467

(51) Int. Cl.[7] .................................................. B32B 17/00
(52) U.S. Cl. .......................... 428/408; 428/212; 428/217; 428/688; 428/698; 428/702; 428/704; 428/908.8
(58) Field of Search .................................. 428/408, 212, 428/217, 688, 702, 704, 698, 908.8

(56) References Cited

U.S. PATENT DOCUMENTS

| Re. 32,464 | 7/1987 | Aine . |
|---|---|---|
| 1,566,848 | 12/1925 | Fonda . |
| 2,344,906 | 3/1944 | Swanson . |
| 2,392,682 | 1/1946 | Marek . |
| 3,084,394 | 4/1963 | Lewis . |
| 3,335,345 | 8/1967 | Diefendorf . |
| 3,630,677 | 12/1971 | Angus . |
| 3,944,686 | 3/1976 | Froberg . |
| 3,961,103 | 6/1976 | Aisenberg . |
| 4,060,660 | 11/1977 | Carlson et al. . |
| 4,104,441 | 8/1978 | Fedoseev et al. . |
| 4,142,008 | 2/1979 | DeBolt . |

(List continued on next page.)

FOREIGN PATENT DOCUMENTS

| 2065431 | 10/1973 | (DE) . |
|---|---|---|
| 0 175 980 | 4/1986 | (EP) . |

(List continued on next page.)

OTHER PUBLICATIONS

Kieser et al. "Large Scale Microwave Plasma Polymerization: A Study on Hydrogenated Carbon Films" J. Vac. Sci. Technol. A 4(2), Mar./Apr. 1986, pp. 222–225.

Chemical Abstracts, vol. 92, 1980, pp. 262 (No month).

Kawarada et al. "Large Area Chemical Vapour Deposition of Diamond Particles and Films Using Magneto–Microwave Plasma" J.J.A.P., vol. 26, No. 6, Jun. 1987, pp. L1032–L1034.

(List continued on next page.)

*Primary Examiner*—Deborah Jones
*Assistant Examiner*—Bryant Young
(74) *Attorney, Agent, or Firm*—Eric J. Robinson; Nixon Peabody LLP

(57) ABSTRACT

An abrasion-proof and static-erasing coating is formed on the contact surface of a contact image sensor. The coating comprises a first film having a high hardness and a low conductivity, a second film formed on the first film and having a low hardness and a high conductivity, and a third film having a high hardness and a high resistivity providing an abrasion-proof insulating external surface.

48 Claims, 9 Drawing Sheets

U.S. PATENT DOCUMENTS

| | | |
|---|---|---|
| 4,194,027 | 3/1980 | Adams et al. . |
| 4,401,054 | 8/1983 | Matsuo et al. . |
| 4,434,188 | 2/1984 | Kamo et al. . |
| 4,504,519 | 3/1985 | Zelez . |
| 4,524,106 | 6/1985 | Flasck . |
| 4,569,738 | 2/1986 | Kieser et al. . |
| 4,597,844 | 7/1986 | Hiraki et al. . |
| 4,634,605 | 1/1987 | Wiesmann . |
| 4,645,713 | 2/1987 | Shioya et al. . |
| 4,647,494 | 3/1987 | Meyerson et al. . |
| 4,661,409 | 4/1987 | Kieser et al. . |
| 4,663,183 | 5/1987 | Ovshinsky et al. . |
| 4,698,256 | 10/1987 | Giglia et al. . |
| 4,701,317 | 10/1987 | Arakawa et al. . |
| 4,707,384 | 11/1987 | Schachner et al. . |
| 4,717,622 | 1/1988 | Kurokawa et al. . |
| 4,725,345 | 2/1988 | Sakamoto et al. . |
| 4,734,339 | 3/1988 | Schachner et al. . |
| 4,743,522 | 5/1988 | Iino et al. . |
| 4,755,426 | 7/1988 | Kokai et al. . |
| 4,770,940 | 9/1988 | Ovshinsky et al. . |
| 4,772,513 | 9/1988 | Sakamoto et al. . |
| 4,777,090 | 10/1988 | Ovshinsky et al. . |
| 4,816,286 | 3/1989 | Hirose . |
| 4,816,291 | 3/1989 | Desphandey et al. . |
| 4,833,031 | 5/1989 | Kurokawa et al. . |
| 4,835,070 | 5/1989 | Kurokawa et al. . |
| 4,849,290 | 7/1989 | Fujimori et al. . |
| 4,869,923 | 9/1989 | Yanazaki . |
| 4,880,687 | 11/1989 | Yokoyama et al. . |
| 4,933,303 | 6/1990 | Ikoma et al. . |
| 4,935,303 | 6/1990 | Ikoma et al. . |
| 4,939,054 | 7/1990 | Hotomi et al. . |
| 4,996,079 | 2/1991 | Itoh . |
| 5,013,579 | 5/1991 | Yamazaki . |
| 5,110,676 | 5/1992 | Murai et al. . |
| 5,159,508 | 10/1992 | Grill et al. . |
| 5,190,824 | 3/1993 | Itoh . |
| 5,275,850 | 1/1994 | Kitoh et al. . |

FOREIGN PATENT DOCUMENTS

| | | |
|---|---|---|
| 0 257 439 | 3/1988 | (EP) . |
| 64-62468 | 3/1989 | (JO) . |
| 55-8485 | 1/1980 | (JP) . |
| 58-48428 | 2/1983 | (JP) . |
| 58-48428 | 3/1983 | (JP) . |
| 58-110494 | 7/1983 | (JP) . |
| 59-63732 | 4/1984 | (JP) . |
| 59-170262 | 9/1984 | (JP) . |
| 60-36663 | 2/1985 | (JP) . |
| 60-103098 | 6/1985 | (JP) . |
| 60-137898 | 7/1985 | (JP) . |
| 60-184681 | 9/1985 | (JP) . |
| 60-191097 | 9/1985 | (JP) . |
| 60-195094 | 10/1985 | (JP) . |
| 61-36200 | 2/1986 | (JP) . |
| 61-73882 | 4/1986 | (JP) . |
| 61-106478 | 5/1986 | (JP) . |
| 61-109628 | 5/1986 | (JP) . |
| 61-208056 | 9/1986 | (JP) . |
| 61-257466 | 11/1986 | (JP) . |
| 62-171993 | 7/1987 | (JP) . |
| 62-280364 | 12/1987 | (JP) . |
| 63-40800 | 2/1988 | (JP) . |
| 63-153275 | 6/1988 | (JP) . |
| 63-183620 | 7/1988 | (JP) . |
| 63-28656 | 11/1988 | (JP) . |
| 64-62468 | 11/1988 | (JP) . |
| 1-267401 | 10/1989 | (JP) . |

OTHER PUBLICATIONS

Moravec et al., "Electron Spectroscopy of Ion Beam and Hydrocarbon Plasma Generated Diamond Like Carbon Films" J. Vac. Sci. Technol., 18)2) Mar. 1981, pp. 226–228.

IEEE Transactions on Magnetics, vol. Mag–22, No. 5, Sep. 1986, "Dual–Carbon", A new Surface Protective Film For Thin Film Hard Disks, M. Ishikawa, N. Tani, T. Yamada, Y, Ota, K Nakamura and A. Itoh, pp. 999–1001.

IBM Technical Disclosure Bulletin, vol. 25, No. 7A, Dec., 1982, pp. 3173, Sliders for Magnetic Heads of Surface–Hardened Silicon with Integrated Electronic Components, G. Kaus et al.

Raman Spectra of Diamondlike Amorphous Carbon Films, J. Appl. Phys. 64 (11), Dec., 1, 1988, pp. 6464–6468, M. Yoshikawa, G. Katagiri, H. Ishida, A. Ishitania, and T. Akamatsu.

Deposition of Diamond–Like Carbon Films by Pulsed–Laser Evaporation, Japanese Journal of Applied Physics, vol. 26, No. 9, Sep. 9, 1987, pp. L–1487–1488, By Tetsuya Sato, Shigeo Furuno, Satoshi Uguchi, and Mitsugu Hanabusa.

Resonant Raman Scattering of Diamondlike Amorphous Carbon Films, Appl. Phys. Let. 52(19), May 1988, pp. 1639–1641, by M. Yoshikawa, G. Katagiri, H. Ishida, and A. Ishitani.

Physical Properties of Diamondlike Carbon Film Deposited in Mixed Atmospheres of $C_2H_4$–Ar. $C_2$, $H_4$–$H_2$, and $C_2H_4$–$N_2$, J. Vac. Sci. Tech. A 14(4), Jul./Aug. 1996, pp 2418–2426, by Masatoshi Makayama, Yashuhiro Matsuba, Junichi Shimamura, Yasuyuki Yamamoto, Hiroshi Chihara, and Hideo Kato.

IEEE Transactions on Magnetics, vol. Mag–22, No. 5, Sep. 1986, Dual–Carbon, A New Surface Protective Film For Thin Film Hard Disks, M. Ishikawa, N. Tani, T. Yamada, Y. Ota, K, Nakamura and A. Itoh, pp. 999–1001.

F I G. 2
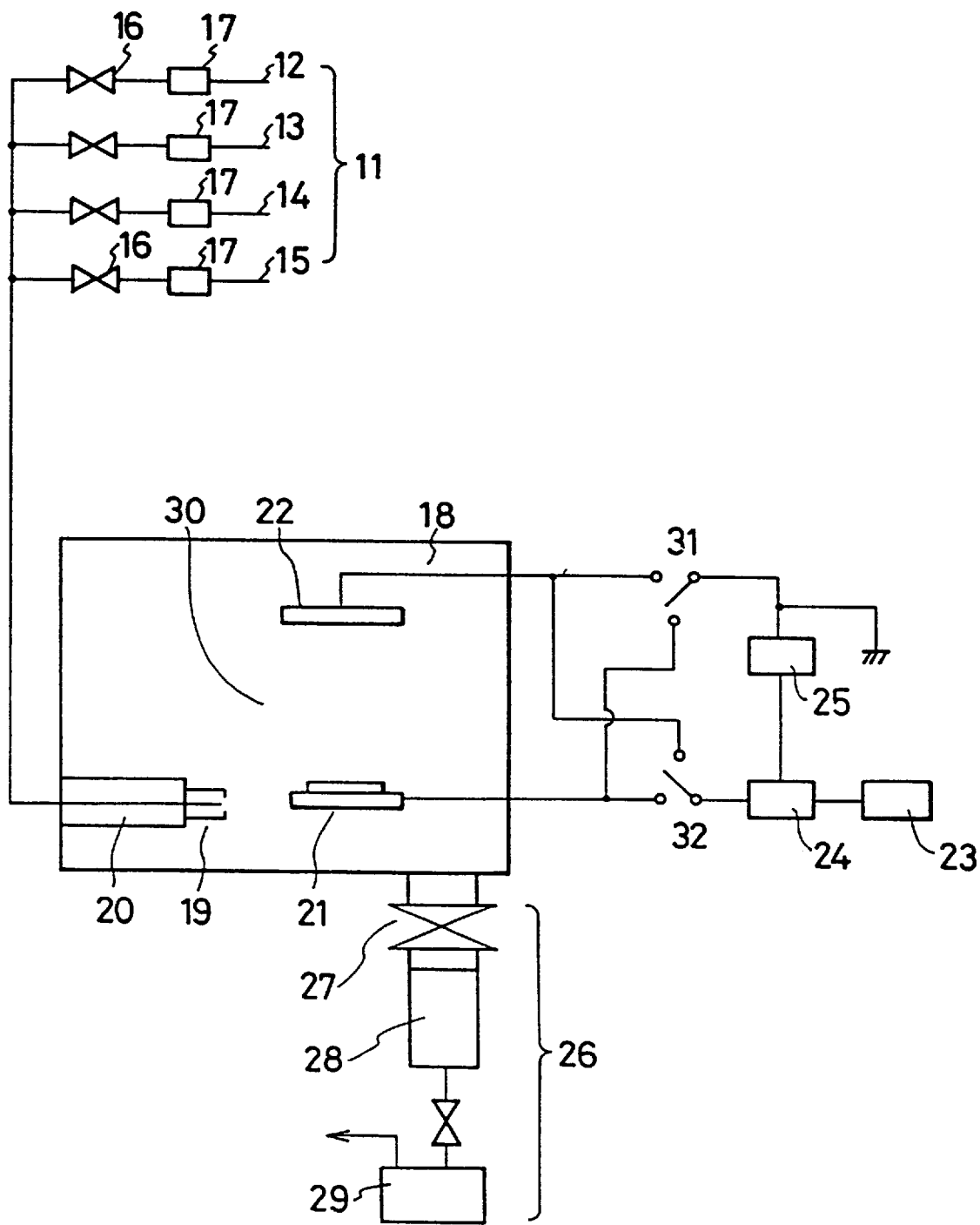

F I G. 7(A)
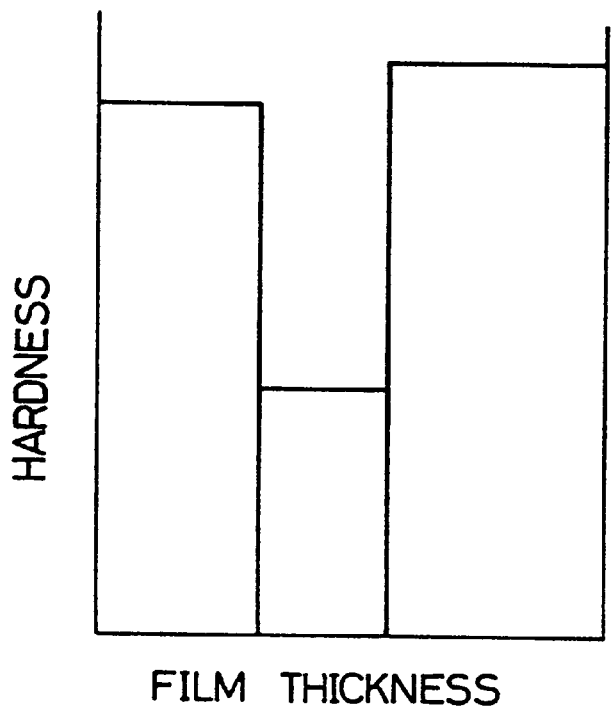
F I G. 7(B)
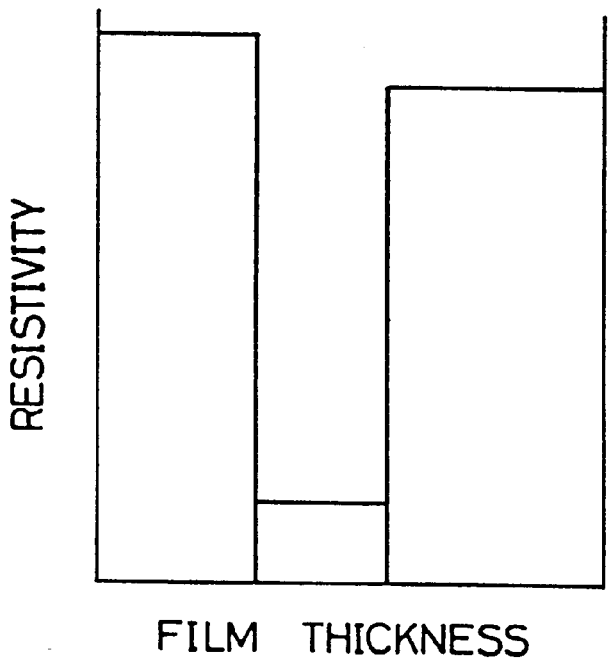

ELECTROSTATIC-ERASING ABRASION-PROOF COATING AND METHOD FOR FORMING THE SAME

This application is a divisional application of application Ser. No. 08/016,240 filed Feb. 11, 1993, which is a divisional application of application Ser. No. 07/660,949 filed Feb. 26, 1991, now U.S. Pat. No. 5,190,824, which itself was a continuation-in-part of application Ser. No. 07/318,541 filed Mar. 3, 1989, now abandoned.

BACKGROUND OF THE INVENTION

This invention relates to an electrostatic erasing abrasion-proof coating and method for forming the same.

Abrasion-proof coatings are formed over surfaces which has a tendency to take scratches due to external rubbing actions. The surface of glass plates which may be used for transmitting light therethrough is a typical example of such a surface. Contact image sensor, which have been recently developed, are suitable for use in compact facsimile machines, copying machines or the like. The image sensor makes direct contact with an original and scans the surface of the original by moving relative to this.

An example of the contact image sensor is illustrated in FIG. 1. The sensor comprises a glass substrate 1, a photosensitive semiconductor device 2, a transparent protective layer 3, an adhesive layer 4, an ITO film 5 and a glass pane 6. An original bearing an image to be sensed is placed in contact with the external surface of the glass pane 6. The ITO film, which is a transparent conductive film, is grounded for the purpose of canceling out electrostatic charges collected on the contact surface of the pane 6 due to rubbing action between the original 9 and the glass pane 6. In case of treatment of usual papers, the size of scratches may be of the order of 1 micron meter or less so that the performance of the sensor is not substantially deteriorated by the scratches. However, if a staple is held to a paper to be telefaxed, the paper may give scratches of substantial size which degrade the quality of the transmission. Furthermore, the use of the ITO film for canceling out static electricity increases the size and the production cost of the device.

SUMMARY OF THE INVENTION

It is therefore an object of the invention to provide an excellent abrasion-proof coatings and methods for forming the same which produce no static electricity on the coating even when rubbing action takes place thereon.

In order to accomplish the above and other objects, it is proposed to coat a surface with carbon films in different deposition conditions in order that the external surface of the coating has a higher degree of hardness for providing an abrasion-proof surface and that the carbon coating includes an inner layer whose resistivity is comparatively low (conducting) to extinguish the influence of static electricity. This structure can be realized by inverting the polarity of the pair of electrodes, between which direct or high frequency electric energy is supplied, an object to be coated being mounted on one of the electrodes. When the electrode supporting the object is supplied with high frequency energy (that is to say, the electrode functions as the cathode), the hardness of carbon material becomes high. On the other hand, when the electrode supporting the object is grounded (i.e., the electrode functions as an anode), the hardness becomes low but the conductivity thereof becomes high. By letting the surface be a cathode, carbon material being deposited is eliminated due to bombardment of positive ions such as hydrogen ions, where the elimination rate of soft carbon material is higher than that of hard carbon material.

According to a preferred embodiment of the present invention, the energy band gap of carbon product for forming the external abrasion-proof surface of the coating is not lower than 1.0 eV, preferably 1.5 to 5.5 eV: the Vickers hardness is not lower than 500 Kg/mm$^2$, preferably not lower than 2000 Kg/mm$^2$, ideally not lower than 6500 Kg/mm$^2$, at the external surface of carbon coatings: the resistivity ranges from $10^{10}$ to $10^{15}$ ohm centimeter: and the thermal conductivity of the product is not lower than 2.5 W/cm deg, preferably 4.0 to 6.0 W/cm deg. When used for thermal heads or contact image sensor which are frequently subjected to rubbing action, the smooth, hard and static erasing surface of the carbon coating is very suitable. The carbon coating includes an inner layer region having a low resistivity. The Vickers hardness and the resistivity of the inner layer region are not higher than 1000 Kg/mm$^2$, preferably 500 to 700 Kg/mm$^2$, and not higher than $10^{12}$ ohm centimeter, preferably $1\times10^2$ to $1\times10^6$ ohm centimeter. The inner layer region has lower Vickers hardness and higher conductivity than the external surface.

BRIEF DESCRIPTION OF THE DRAWINGS

FIG. 2 is a schematic diagram showing a CVD apparatus for depositing carbon material in accordance with the present invention.

FIGS. 6(A), 6(B), 7(A), 7(B), 8(A), and 8(B) are graphical diagrams showing the variations of the hardness and the resistivity of carbon films through the depth thereof in accordance with the present invention.

DETAILED DESCRIPTION OF THE PREFERRED EMBODIMENTS

Figure 1:
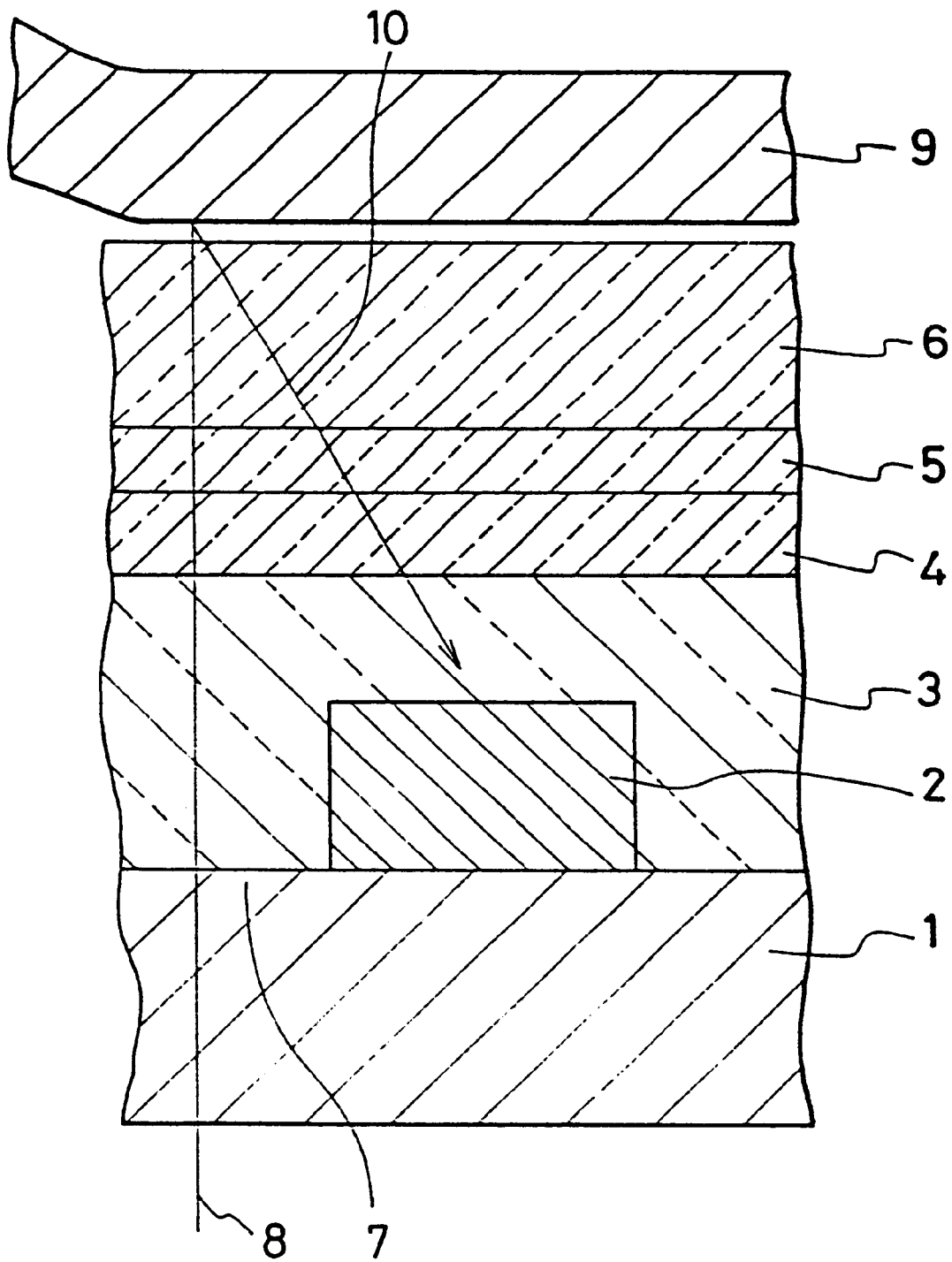
FIG. 1 is a cross sectional view showing a prior art contact image sensor.

Referring to FIG. 2, there is shown a plasma CVD apparatus for depositing carbon material on a surface in accordance with the teaching of the present invention. The surface to be coated may, for example, be made of semiconductor, glass, metal, ceramics, organic resins, magnetic substance, and so forth.

The apparatus comprises a reaction chamber 18 defining a reaction space 30 therein, first and second electrodes 21 and 22, a high frequency electric power source 23 for supplying electric power between the electrodes 21 and 22 through a matching transformer 24, a DC bias source 25 connected in series between the electrodes 21 and 22, a gas feeding system 11 consisting of four passages 12 to 15 each of which is provided with a flow meter 17 and a valve 16, a microwave energy supply 20, a nozzle 19 through which gas excited by the microwave energy supply 20 is introduced into the reaction space 30, and an exhaust system 26 including a pressure control valve 27, a turbomolecular pump 28 and a rotary pump 29. The electrodes are designed such that (the area of the first electrode 21)/(the area of the second electrode 22)<1. A pair of switching means 31 and 32 is provided for inverting the polarities of the electrodes 21 and 22. In a first position of the switching means, the electrode is grounded while the other electrode 21 is supplied with high frequency electric energy from the power source 23. In the other second position, the electrode 21 is grounded while the electrode 22 is supplied with high frequency electric energy from the power source 23. An object having the surface to be coated is mounted on the electrode 21.

In operation of this apparatus, a carrier gas of hydrogen is introduced to the reaction space 30 from the gas feeding passage 12 as well as a reactive gas of a hydrocarbon such as methane or ethylene from the gas feeding passage 13. The gas introduction rates of hydrogen and the hydrocarbon are 3:1 to 1:3, preferably 1:1. In addition to this, a V-Group dopant gas such as $NH_3$ or $PH_3$, or a III-Group dopant gas may be inputted to the reaction space 30 through the gas feeding passage 14 or 15 in order to form impurity semiconductors. Pre-excitation may be effected by the microwave energy supply 10. The pressure in the reaction space is maintained within the range between 0.001 to 10 Torr, preferably 0.01 to 0.5 Torr. High frequency electric energy at a frequency not lower than 1 GHz, e.g. 2.45 GHz, is applied to the reactive gas at 0.1 to 5 kilo Watt for breaking C—H bonds. When the frequency is selected to be 0.1 to 50 MHz, C=C bonds can be broken and transformed to —C—C— bonds. By virtue of this reaction, carbon atoms are deposited atoms in the form of a structure in which the diamond structure occurs at least locally.

A bias voltage of, for example, −200 to 600 V is set at the DC bias source 25. The effective bias voltage level is substantially −400 to +400 V when a self bias level in this case of −200 V is spontaneously applied between the electrodes 21 and 22 with the bias voltage level of the source 25 being zero.

Generally, the high frequency input power is chosen between 10 Watt and 5 kilo Watt, preferably between 50 Watt and 1 kilo Watt. This input power corresponds to 0.03 to 3 Watt/$cm^2$ in terms of plasma energy. The substrate temperature is maintained in a range of +250 to −100° C. by means of a temperature control means (not shown). When diamond deposition is desired, the substrate temperature has to be elevated further.

Figure 3:
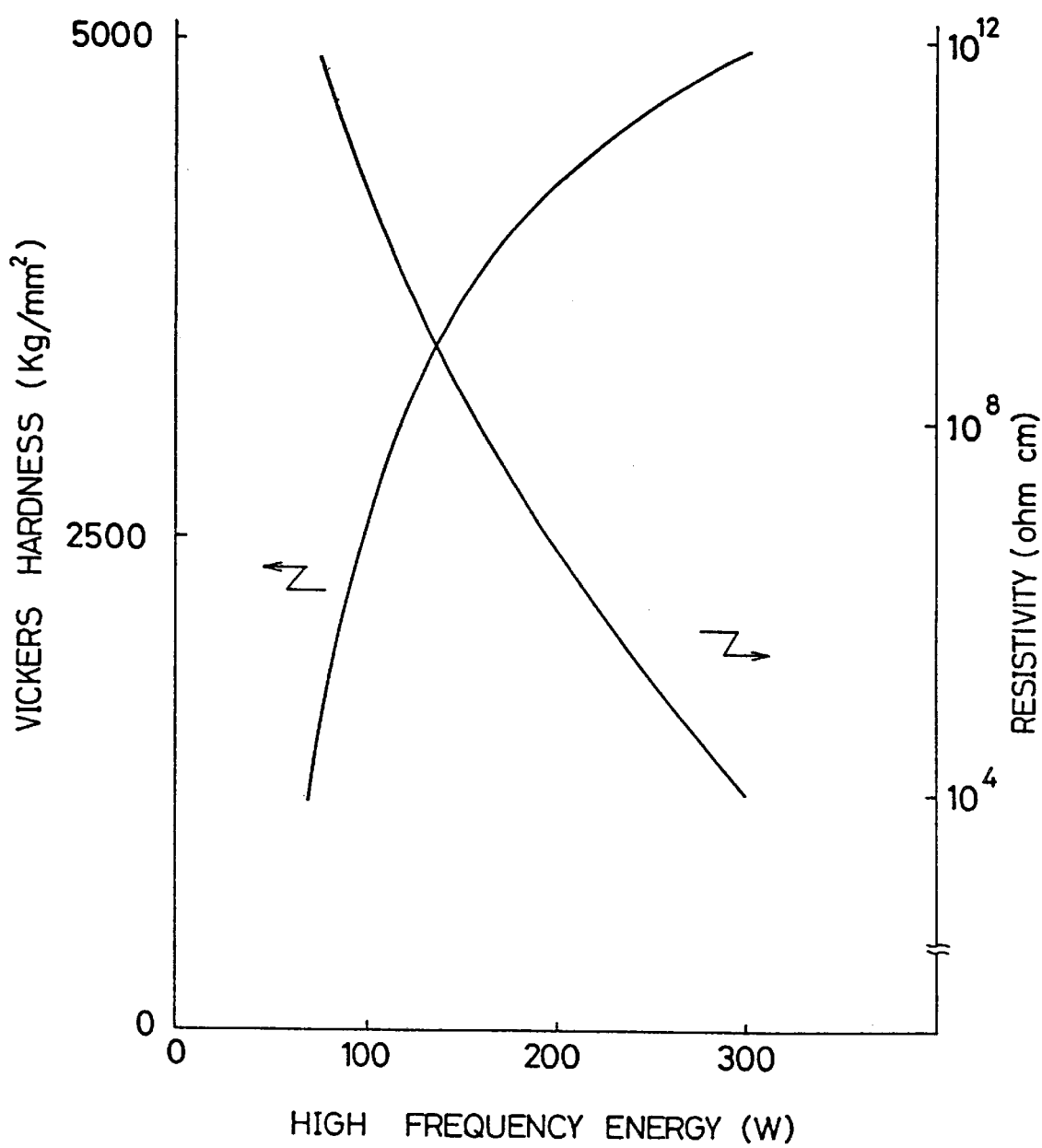
FIG. 3 is a graphical diagram showing the Vickers hardness and the resistivity of carbon films which have been deposited on an electrode functioning as a cathode.
Figure 4:
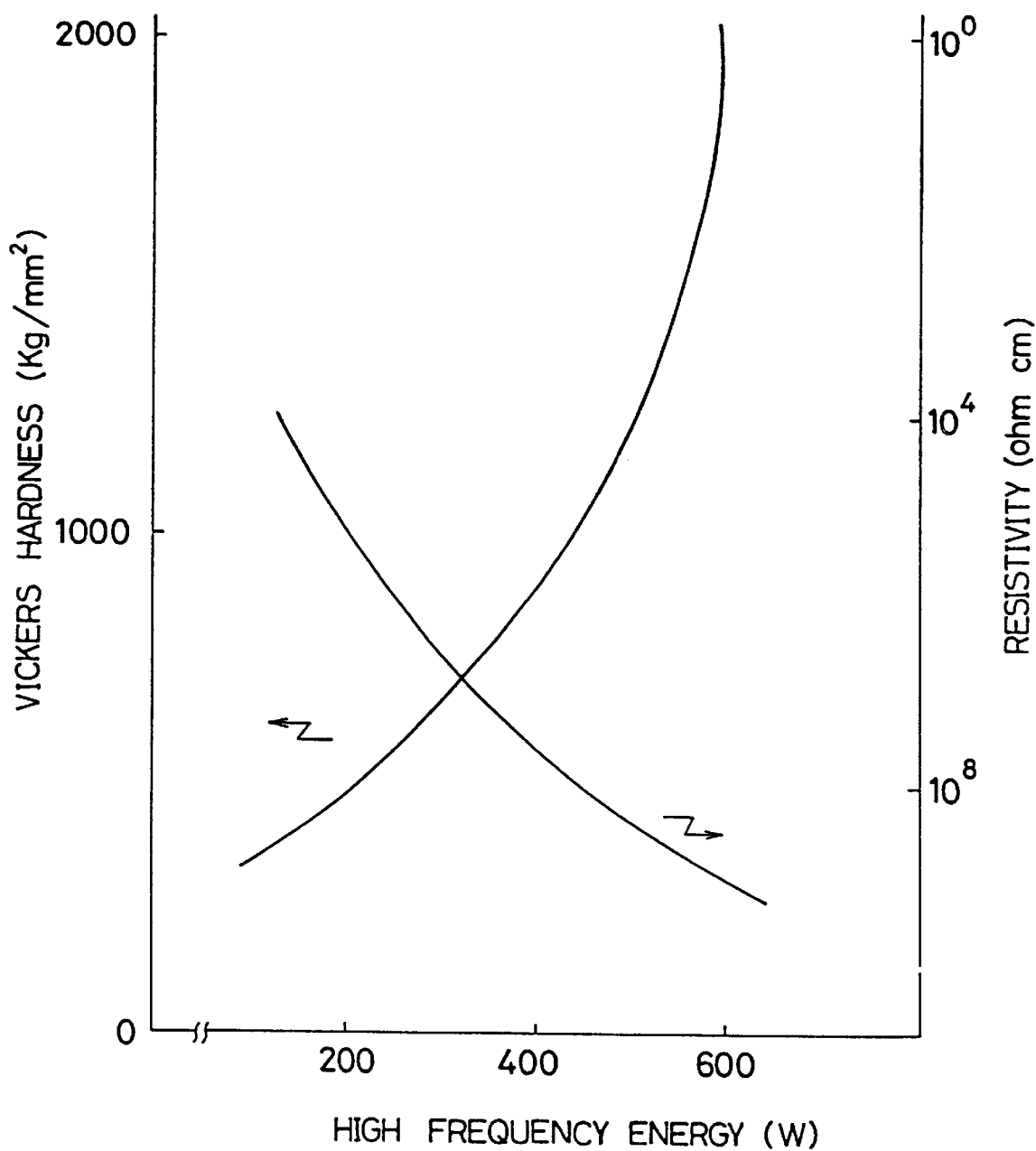
FIG. 4 is a graphical diagram showing the Vickers hardness and the resistivity of carbon films which have been deposited on an electrode functioning as an anode.

FIG. 3 shows the resistivity and the Vickers hardness of films deposited on a surface, to which high frequency electric energy was applied through the electrode 21 at various power levels. As can be seen from the figure, a harder film was deposited by inputting higher power energy. FIG. 4 shows the resistivity and the Vickers hardness of films deposited on a surface which was grounded. Comparing FIG. 4 with FIG. 3, it will be apparent that the resistivity of carbon films formed at the anode side (on the grounded electrode) becomes lower than that in the cathode side (supplied with high frequency energy).

Figure 6A:
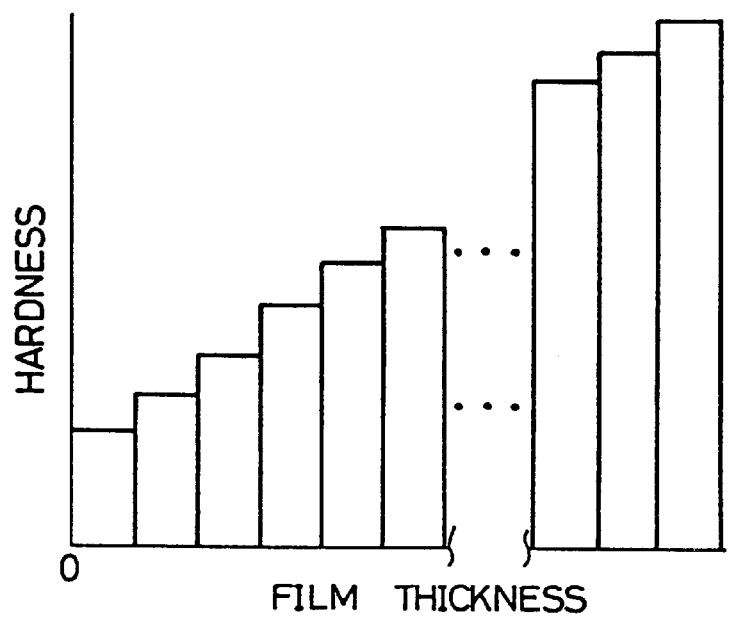
Figure 6B:

In accordance with the teaching of the present invention, a surface is coated with a carbon coating while the deposition condition is changed in order that the hardness of the carbon initially or intermediately deposited on the substrate is relatively low, but the deposition condition is changed such that hardness of the carbon finally deposited becomes very high in order to provide a hard external abrasion-proof surface. This procedure can be carried out in two ways. As seen from FIG. 6(A), the hardness may be changed in steps by stepwise change of the deposition condition in accordance with the above description. Alternatively, as seen from FIG. 6(B), the hardness may be changed continuously from the inner surface to the external surface of the carbon coating.

Figure 5:
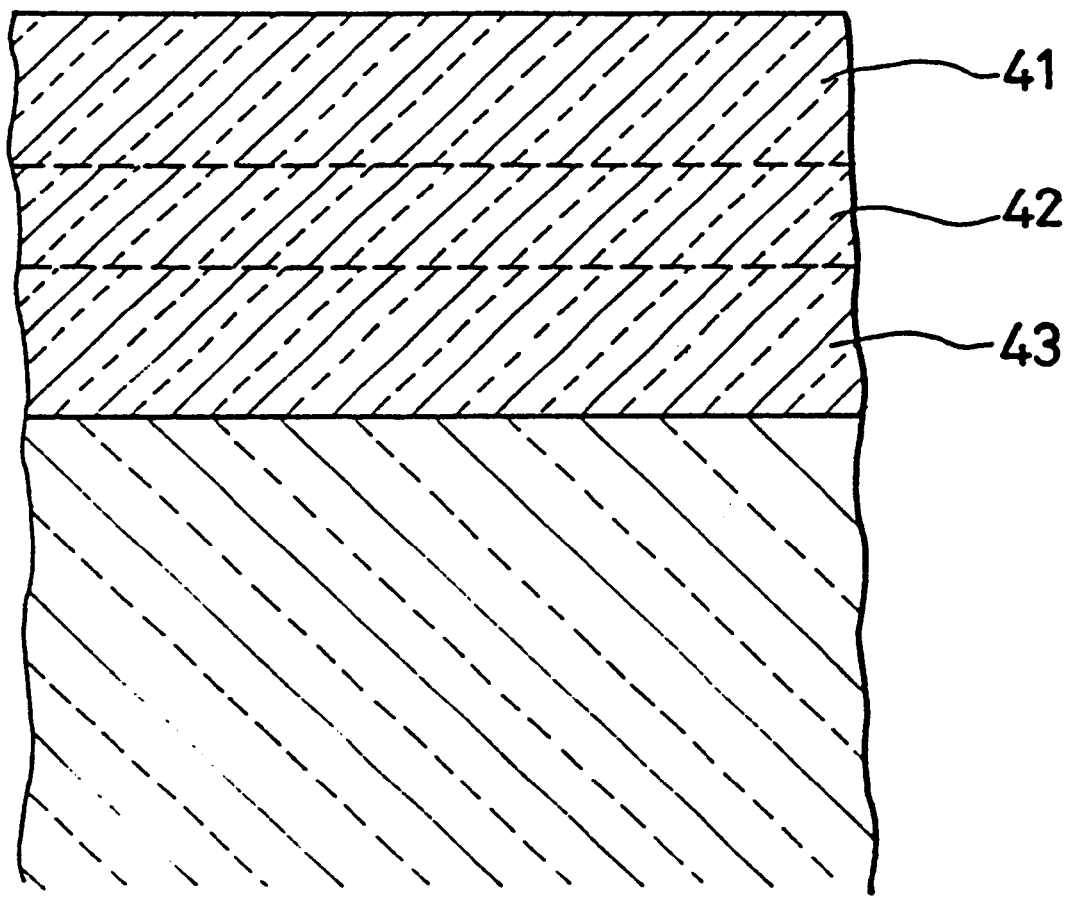
FIG. 5 is a schematic diagram of a carbon coating in accordance with the present invention.

The hardness or resistivity of the carbon coating can be changed, rather than monotonically, in order that an intermediate region of the coating is conductive and sandwiched by hard carbon regions. FIG. 5 illustrates such a case including three carbon film regions. The lower and top films 41 and 43 are deposited to have a high degree of hardness while the intermediate film 42 is deposited to have low resistivity. This example can be realized in two ways as illustrated in FIG. 7 (stepwise change) and FIG. 8 (continuous change). The lower hard film 41 is semi-insulating so that it protects the surface to be coated electrically and mechanically. Further the lower hard film has a function as a blocking layer to prevent impurity from entering into the intermediate film 42 and also a function of improving adhesivity to the substrate and the electrical property. The intermediate region 42 has conductivity and functions as a Buffer layer to alleviate distortion generated by mechanical stress.

EXPERIMENT 1

Figure 9:
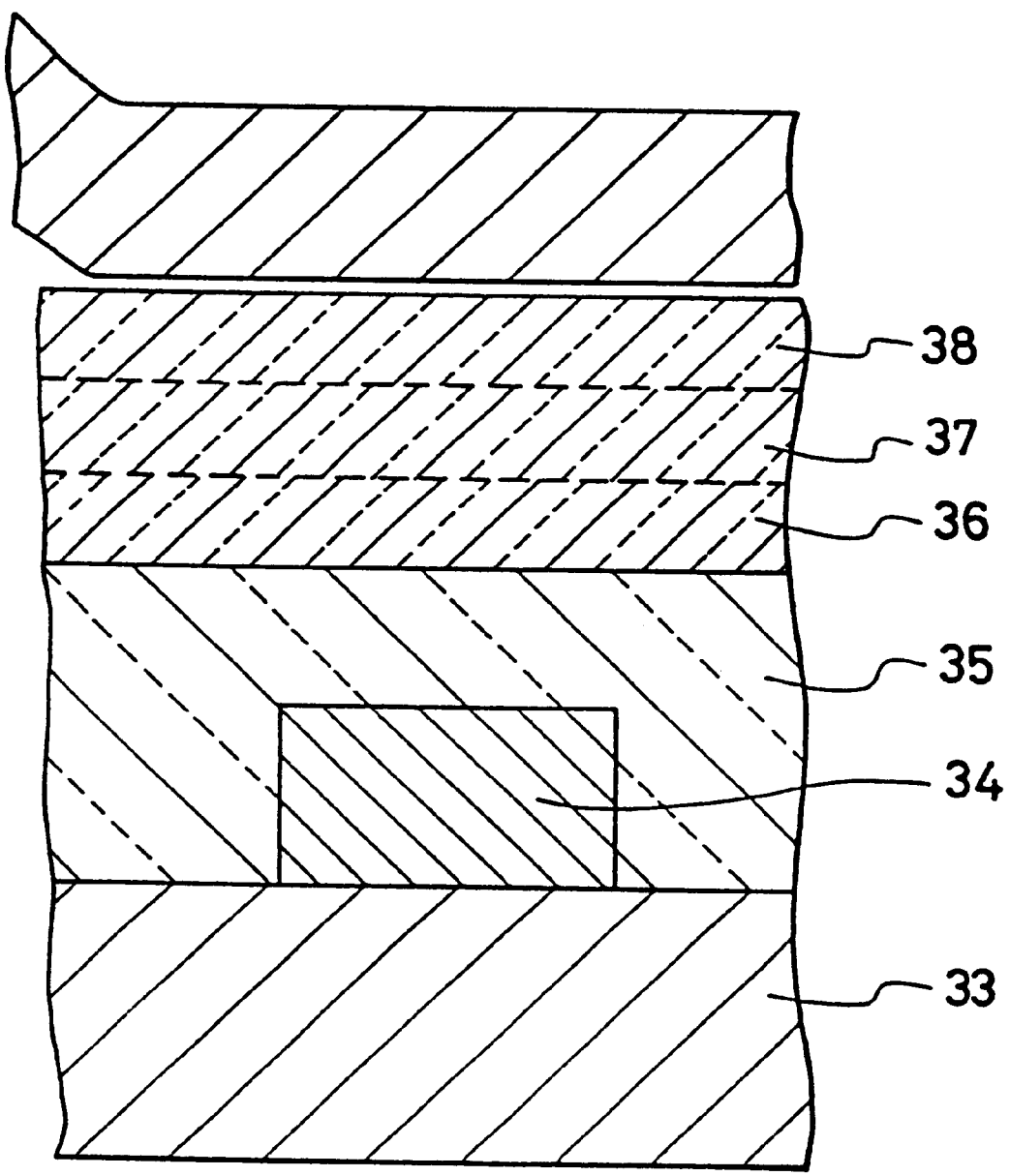
FIG. 9 is a cross sectional view showing an image sensor given a carbon coating in accordance with the present invention.

A carbon coating was deposited on a transparent polyimide film 35 as shown in FIG. 9. An amorphous silicon photosensitive semiconductor device 34 was formed on a glass substrate 33 in a conventional manner as well as the polyimide film 35. A first carbon film 36 of 0.6 micron meter thickness was formed on the polyimide film 35 under deposition conditions that the structure was placed on the electrode (cathode) supplied with high frequency energy of 260 W, the introduction rate of carbide gas such as methane, ethylene, or ethane diluted by hydrogen (e.g. methane:hydrogen=1:1) was 100 SCCM, the pressure of the reactive gas was 0.03 Torr, and the deposition time was 60 minutes. The hardness and the resistivity were measured to be 1000 Kg/$mm^2$ and $1\times10^{12}$ ohm centimeter. A second carbon film 37 of 0.5 micron meter thickness was formed on the first film 36 under deposition conditions that the electrode supporting the structure was grounded (as an anode), the input high frequency energy was 300 W, the introduction rate of carbide gas such as methane, ethylene, or ethane diluted by hydrogen (e.g. methane:hydrogen=1:1) was 100 SCCM, the pressure of the reactive gas was 0.03 Torr, and the deposition time was 40 minutes. The hardness and the resistivity were measured to be 600 Kg/$mm^2$ and $1\times10^{10}$ ohm centimeter. Finally, a third carbon film 38 was deposited in the same deposition conditions as the first film 36. The first film may be dispensed with.

EXPERIMENT 2

Figure 8A:
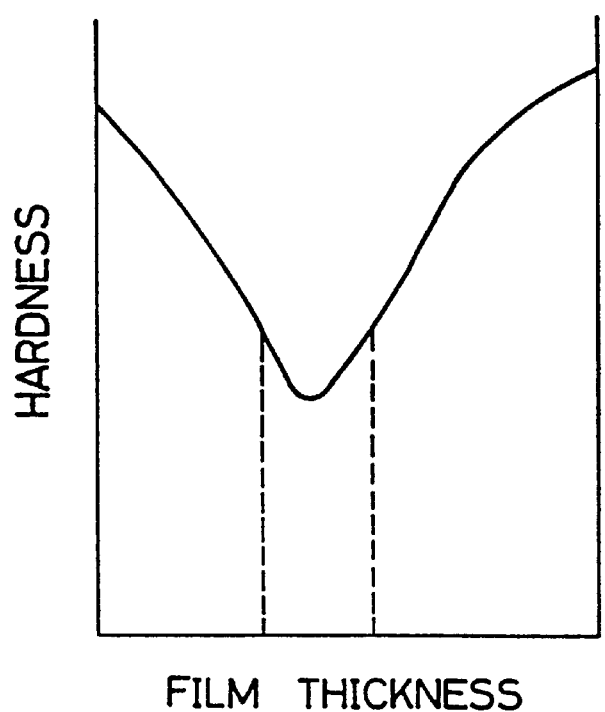
Figure 8B:
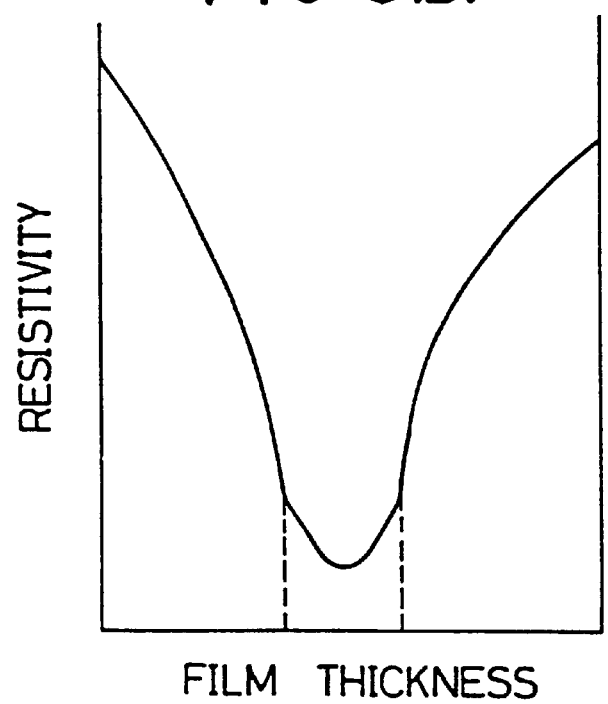

This was carried out in accordance with the diagram shown in FIGS. 8(A) and 8(B) rather than FIGS. 7(A) and 7(B). That is, the resistivity and the hardness were continuously decreased and increased along with the decrease and the increase of input energy. Carbon deposition was started under the deposition conditions that the structure was placed on the electrode (cathode) supplied with high frequency energy of 300 W, the introduction rate of carbide gas such as methane, ethylene, or ethane diluted by hydrogen (e.g. methane:hydrogen=1:1) was 100 SCCM, and the pressure of the reactive gas was 0.03 Torr. The input high frequency energy was gradually decreased from 300 W to 200 W at 0.5 to 2.5 W/min. The hardness and the resistivity were decreased, along with the decrease of the input energy, from 1000 Kg/mm$^2$ to 500 Kg/mm$^2$ and from 1×10$^{12}$ ohm centimeter to not lower than 1×10$^8$ ohm centimeter respectively. The total thickness of this carbon coating was 0.2 micron meter. After the positions of the switch 31 and 32 were reversed (i.e. the electrode 21 was grounded as an anode), carbon deposition was resumed while the input power was decreased from 300 W to 200 W and subsequently increased from 200 W to 300 W at 0.5 to 2.5 W/min. The hardness and the resistivity were changed along with the change of the input energy, that is, the hardness was decreased from 500 Kg/mm$^2$ to 300 Kg/mm$^2$ and subsequently increased from 300 Kg/mm$^2$ to 500 Kg/mm$^2$ and the resistivity was decreased and then increased within the range between 1×10$^{12}$ ohm centimeter and 1×10$^8$ ohm centimeter. However, the resistivity of this intermediate layer should be lower than that of the underlying hard carbon coating as illustrated in FIGS. 8(A) and 8(B). The total thickness of this carbon coating was 0.4 to 1 micron meter. After the positions of the switch 31 and 32 were reversed again in the initial positions (i.e. the electrode 21 was supplied with high frequency energy as a cathode), carbon deposition was resumed while the input power was increased from 200 W to 300 W at 0.5 to 2.5 W/min. The hardness and the resistivity were increased, along with the input energy, from 500 Kg/mm$^2$ to 2000 Kg/mm$^2$ and from not lower than 1×10$^8$ ohm centimeter to 1×10$^{12}$ ohm centimeter. However, the resistivity of this upper carbon film should be higher than that of the intermediate layer. The total thickness of this carbon coating was 0.3 to 0.7 micron meter.

EXPERIMENT 3

A first carbon film of 0.6 micron meter thickness was formed on the polyimide film under deposition conditions that the structure was placed on the electrode (cathode) supplied with high frequency energy of 260 W, the introduction rate of carbide gas such as methane, ethylene, or ethane diluted by hydrogen (e.g. methane:hydrogen=1:1) was 100 SCCM, the pressure of the reactive gas was 0.03 Torr, and the deposition time was 60 minutes. The hardness and the resistivity were measured to be 1000 Kg/mm$^2$ and 1×10$^{12}$ ohm centimeter. A second carbon film of 0.5 micron meter thickness was formed on the first film under deposition conditions that the electrode supporting the structure was grounded (as an anode), the input high frequency energy was 300 W, the introduction rate of carbide gas such as methane, ethylene, or ethane diluted by hydrogen was 100 SCCM, the pressure of the reactive gas was 0.03 Torr, and the deposition time was 40 minutes. The hardness and the resistivity were measured to be 600 Kg/mm$^2$ and 1×10$^{10}$ ohm centimeter. On the second film, a third external film was deposited at an input energy of 80 W for 50 min., at 150 W for 50 min. and at 300 W for 40 min. sequentially. Then the third film was formed, having its resistivities of 5×10$^{10}$, 2×10$^{12}$, and 1×10$^{14}$ ohm centimeter across its thickness of 1.7 micron meters.

EXPERIMENT 4

A first carbon film of 0.6 micron meter thickness was formed on the polyimide film under deposition conditions that the structure was placed on the electrode (cathode) supplied with high frequency energy of 260 W, the introduction rate of carbide gas such as methane, ethylene, or ethane diluted by hydrogen (e.g. methane:hydrogen=1:1) was 100 SCCM, the pressure of the reactive gas was 0.03 Torr, and the deposition time was 60 minutes. The hardness and the resistivity were measured to be 1000 Kg/mm$^2$ and 1×10$^{12}$ ohm centimeter. After the positions of the switch 31 and 32 were reversed (i.e. the electrode 21 was grounded as an anode), a second carbon film was formed while the input power was decreased from 300 W to 200 W and subsequently increased from 200 W to 300 W at 0.5 to 2.5 W/min. The hardness and the resistivity were changed along with the change of the input energy, that is, the hardness was decreased from 500 Kg/mm$^2$ to 300 Kg/mm$^2$ and subsequently increased from 300 Kg/mm$^2$ to 500 Kg/mm$^2$ and the resistivity was decreased and then increased within the range between 1×10$^{12}$ ohm centimeter and 1×10$^8$ ohm centimeter. However, the resistivity of this second carbon film should be lower than that of the first carbon film. The total thickness of this carbon coating was 0.4 to 1 micron meter. On the second film, a third external film was deposited at an input energy of 80 W for 50 min., at 150 W for 50 min. and at 300 W for 40 min. sequentially. Then the third film was formed, having its resistivities of 5×10$^{10}$, 2×10$^{12}$, and 1×10$^{14}$ ohm centimeter across its thickness of 1.7 micron meters.

EXPERIMENT 5

First and third carbon films were deposited in diamond structure. The deposition conditions required to deposited carbon crystals (diamond) were 700 to 900° C. (substrate temperature), 1.0 to 5 KW (input high frequency energy), 12 hours (deposition time) and $CH_4/H_2$=0.1 to 4 (reactive gas), 3 to 80 Torr (pressure). The thickness of the first and third films were 0.6 micron meter respectively. The Vickers hardness was measured to be 10,000 Kg/mm$^2$. The resistivity was 1×10$^{15}$ ohm centimeter. After the first film deposition, a second carbon film (i.e. intermediate film) of 0.5 micron meter thickness was formed on the first film under deposition conditions that the electrode supporting the structure was grounded (as an anode), the input high frequency energy was 300 W, the introduction rate of methane diluted by hydrogen was 100 SCCM, the pressure of the reactive gas was 0.03 Torr, and the deposition time was 40 minutes. The hardness and the resistivity were measured to be 600 Kg/mm$^2$ and 1×10$^{10}$ ohm centimeter. Subsequently, the third film was formed under the above deposition conditions.

While a description has been made for several embodiments, the present invention should be limited only by the appended claims and should not be limited by the particular examples, and there may be caused to artisan some modifications and variation according to the invention. For example, it has been proved effective to add hydrogen, a halogen, boron, nitrogen, phosphorus or the like into the carbon coating. Preferably, the proportion of hydrogen or a halogen is not higher than 25 atomic % and the proportion of the other additives are not higher than 5%. Also, though the experiments were carried out for depositing carbon coatings on semiconductor substrates, the carbon coatings can be deposited on a substrate made of an organic resin such as PET (polyethyleneterephtalate), PES, PMMA, teflon, epoxy and polyimides, metallic meshes, papers, glass, metals, ceramics, parts for magnetic heads, magnetic discs, and others.

The types of carbon coatings deposited in accordance with the present invention includes amorphous, polycrystals (comprising diamond powders), and diamond films. In the case of a dual film, lower and upper films may be, respectively, amorphous and amorphous (having different hardnesses), amorphous and polycrystals, polycrystals and polycrystals, or polycrystals and a diamond film.

What is claimed is:

1. An article comprising:
   an amorphous film comprising carbon having C—C bonds provided over a surface,
   wherein said amorphous film functions as a surface protective film of the article and a hardness of at least a portion of said amorphous film monotonically changes in a thickness direction thereof, and
   wherein said surface is ceramic.

2. An article according to claim 1 wherein a Vickers hardness of said amorphous film is not lower than 500 kg/mm$^2$.

3. An article according to claim 1 wherein a Vickers hardness of said amorphous film is not lower than 2000 kg/mm$^2$.

4. An article according to claim 1 wherein a Vickers hardness of said amorphous film is not lower than 6500 kg/mm$^2$.

5. An article comprising:
   an amorphous film comprising carbon and nitrogen formed over a surface,
   wherein said amorphous film functions as a surface protective film of said article and a hardness of at least a portion of said amorphous film monotonically changes in a thickness direction thereof, and
   wherein said surface is ceramic.

6. An article according to claim 5 further comprising another film comprising carbon provided on said amorphous film.

7. An article according to claim 5 wherein a Vickers hardness of said amorphous film is not lower than 500 kg/mm$^2$.

8. An article according to claim 5 wherein a Vickers hardness of said amorphous film is not lower than 2000 kg/mm$^2$.

9. An article according to claim 5 wherein a Vickers hardness of said amorphous film is not lower than 6500 kg/mm$^2$.

10. An article provided with a surface protective film, said protective film comprising amorphous carbon having C—C bonds,
    wherein said surface is ceramic and a hardness of at least a portion of said protective film monotonically changes in a thickness direction thereof.

11. An article according to claim 10 wherein said protective film includes at least first and second layers, each comprising said amorphous carbon having C—C bonds.

12. An article according to claim 10 wherein a Vickers hardness of said protective film is not lower than 500 kg/mm$^2$.

13. An article according to claim 10 wherein a Vickers hardness of said protective film is not lower than 2000 kg/mm$^2$.

14. An article according to claim 10 wherein a Vickers hardness of said protective film is not lower than 6500 kg/mm$^2$.

15. An article comprising:
    a substrate having a ceramic surface; and
    a protective film formed over said ceramic surface, said protective film including a first layer comprising carbon and nitrogen and a second layer adjacent to said first layer,
    wherein said second layer is interposed between said first layer and said ceramic surface, and
    wherein a hardness of at least a portion of said protective film monotonically changes in a thickness direction thereof.

16. An article having a surface subject to a rubbing action, comprising:
    a substrate having a ceramic surface; and
    a protective film formed over said ceramic surface, said protective film including a first layer comprising carbon and nitrogen and a second layer adjacent to said first layer,
    wherein said second layer is interposed between said first layer and said ceramic surface, and a hardness of at least a portion of said protective film monotonically changes in a thickness direction thereof.

17. An article comprising:
    a substrate having a ceramic surface; and
    a protective film formed over said ceramic surface, said protective film including a first layer comprising carbon and nitrogen and a second layer interposed between said ceramic surface and said first layer,
    wherein a hardness of at least a portion of said protective film monotonically changes in a thickness direction thereof and said first layer has a Vickers hardness not lower than 500 kg/mm$^2$.

18. An article having a surface subject to a rubbing action, comprising:
    a substrate having a ceramic surface; and
    a protective film formed over said ceramic surface, said protective film including a first layer comprising carbon and nitrogen and a second layer interposed between said ceramic surface and said first layer,
    wherein a hardness of at least a portion of said protective film monotonically changes in a thickness direction thereof and said first layer has a Vickers hardness not lower than 500 kg/mm$^2$.

19. An article comprising:
    a first amorphous film provided on a surface; and
    a second amorphous film comprising carbon having C—C bonds provided on said first surface,
    wherein said second amorphous film functions as a surface protective film of the article and a hardness of at least a portion of said first amorphous film monotonically changes through a thickness direction thereof, and
    wherein said surface is ceramic.

20. An article according to claim 19 wherein said second amorphous film further comprises hydrogen.

21. An article having a ceramic surface, said ceramic surface coated with an abrasion-proof amorphous carbon coating,
    wherein said carbon coating contains hydrogen and a hardness of at least a portion thereof monotonically changes in a thickness direction of said coating.

22. An article according to claim 1 wherein said hardness continuously increases from a bottom portion of said amorphous film to an upper portion thereof.

23. An article according to claim 1 wherein said hardness increases in a stepwise manner from a bottom portion of said amorphous film to an upper portion thereof.

24. An article according to claim 10 wherein said hardness continuously increases from a bottom portion of said protective film to an upper portion thereof.

25. An article according to claim 10 wherein said hardness increases in a stepwise manner from a bottom portion of said protective film to an upper portion thereof.

26. An article according to claim 15 wherein said hardness continuously increases from a bottom portion of said protective film to an upper portion thereof.

27. An article according to claim 15 wherein said hardness increases in a stepwise manner from a bottom portion of said protective film to an upper portion thereof.

28. An article according to claim 16 wherein said hardness continuously increases from a bottom portion of said protective film to an upper portion thereof.

29. An article according to claim 16 wherein said hardness increases in a stepwise manner from a bottom portion of said protective film to an upper portion thereof.

30. An article according to claim 17 wherein said hardness continuously increases from a bottom portion of said protective film to an upper portion thereof.

31. An article according to claim 17 wherein said hardness increases in a stepwise manner from a bottom portion of said protective film to an upper portion thereof.

32. An article according to claim 18 wherein said hardness continuously increases from a bottom portion of said protective film to an upper portion thereof.

33. An article according to claim 18 wherein said hardness increases in a stepwise manner from a bottom portion of said protective film to an upper portion thereof.

34. An article comprising:
    a protective film comprising carbon having C—C bonds provided over a surface comprising ceramic,
    wherein a hardness of said protective film monotonically changes in a thickness direction thereof.

35. An article according to claim 34 wherein said protective film has a Vickers hardness not lower than 2000 kg/mm$^2$.

36. An article according to claim 34 therein said protective film contains hydrogen.

37. An article according to claim 34 wherein said hardness continuously increases from a bottom portion of said protective film to an upper portion thereof.

38. An article according to claim 34 wherein said hardness continuously increases from a bottom portion of said protective film to an upper portion thereof.

39. An article according to claim 1 wherein said amorphous film contains hydrogen.

40. An article according to claim 5 wherein said amorphous film contains hydrogen.

41. An article according to claim 10 wherein said protective film contains hydrogen.

42. An article according to claim 15 wherein said first layer contains hydrogen.

43. An article according to claim 16 wherein said first layer contains hydrogen.

44. An article according to claim 17 wherein said first layer contains hydrogen.

45. An article according to claim 18 wherein said first layer contains hydrogen.

46. An article comprising:
    a ceramic surface; and
    a film comprising carbon and hydrogen formed on said ceramic surface,
    wherein a hardness of said film monotonically changes in a thickness direction thereof.

47. An article according to claim 46 wherein a Vickers hardness of said film is not lower than 2000 kg/mm$^2$.

48. An article according to claim 46 wherein the hardness of said film increases from a lower portion to an upper portion of said film.

* * * * *